United States Patent [19]

Yamashita et al.

[11] Patent Number: 4,661,998
[45] Date of Patent: Apr. 28, 1987

[54] DOUBLE SUPERHETERODYNE TUNER

[75] Inventors: Sadahiko Yamashita, Sagamihara; Makoto Hasegawa, Tokyo; Motoi Ohba, Kawasaki; Koh Kikuchi, Tokyo; Tsutomu Shishido, Yokohama, all of Japan

[73] Assignee: Matsushita Electric Industrial Co. Ltd., Osaka, Japan

[21] Appl. No.: 652,678

[22] Filed: Sep. 19, 1984

[30] Foreign Application Priority Data

Sep. 22, 1983 [JP] Japan ............................... 58-175302
Sep. 22, 1983 [JP] Japan ............................... 58-175303
Sep. 22, 1983 [JP] Japan ............................... 58-175301

[51] Int. Cl.$^4$ ........................... H04B 1/26; H04B 1/08
[52] U.S. Cl. .................................. 455/315; 455/301; 455/347; 455/349
[58] Field of Search ............... 455/300, 301, 349, 347, 455/314–316, 327; 333/185, 202, 204; 361/399, 422

[56] References Cited

U.S. PATENT DOCUMENTS

| | | | |
|---|---|---|---|
| 4,275,369 | 6/1981 | Sekiguchi | 455/316 |
| 4,280,113 | 7/1981 | Sekiguchi | 455/316 |
| 4,352,209 | 9/1982 | Ma | 455/301 |
| 4,353,132 | 10/1982 | Saitoh et al. | 455/315 |
| 4,490,699 | 12/1984 | Yanagida | 333/202 |
| 4,494,095 | 1/1985 | Noji et al. | 455/349 |

Primary Examiner—Jin F. Ng
Attorney, Agent, or Firm—Wenderoth, Lind & Ponack

[57] ABSTRACT

A compact or miniaturized well-shielded double superheterodyne tuner is provided, wherein an input circuit portion, a first mixing portion, a first intermediate frequency bandpass filter, a second mixing portion and an output circuit portion are mounted in separated casings. The first mixing portion and the second mixing portion are provided on printed boards and each mounted on a bottom plate of the casing. The casings containing the first and second mixing portion are arranged in a manner such that grounded surfaces of the printed boards contained in the casings are arranged face to face. The casing containing the bandpass filter is contacted adjacently to a common face of the face to face casings. Each of the casings containing the input and output circuit portions is located adjacently to each of faces common to the face to face casings and the filter containing casing. Some structual improvements are also provided for simplifying the manufacture and adjustment of the tuner.

5 Claims, 12 Drawing Figures

PRIOR ART

DOUBLE SUPERHETERODYNE TUNER

BACKGROUND OF THE INVENTION

This invention relates generally to tuners used in television (TV) receivers for converting a received TV signal into an intermediate frequency signal, and more particularly, the present invention relates to such a tuner of a double superheterodyne system used for the VHF and/or UHF band.

Recently, a double superheterodyne tuner using two local oscillators and two mixers has been developed for receiving a wide frequency range and for avoiding a tracking adjust in adjustment for every received channel. In the system, a radio frequency (RF) input signal is converted into a first intermediate frequency ($IF_1$) signal by mixing with a output from a first local oscillator. The converted $IF_1$ signal is filtered through a band-pass filter and converted into a second intermediate frequency ($IF_2$) signal by mixing with an output from a second local oscillator. In this case, the higher the frequency of $IF_1$ signal is with respect to the upper limit frequency of the receiving signal, the wider in range and the lower in disturbance the signals can be received.

However, as the signal frequency becomes $IF_1$ higher, it becomes difficult to design, assemble and adjust the circuit. That is to say, a circuit portion including a first mixer and a second mixer is operated at very high frequency, and it is therefore necessary to assemble and adjust the circuit portion in a very precise manner. For example, when adjusting or measuring the characteristics of each of functional circuits, such as the first mixer, the second mixer, the first local oscillator, the second local oscillator, etc., it is necessary to connect to and/or separate the functional circuits from each other without any stray components.

Furthermore, in the conventional tuner, a casing containing circuit components therein is constructed of a parallelepiped box in which a plurality of plates are inserted to divide the box into several portions. In these portions, the functional circuits are located and are electrically shielded from each other by the plates. Especially in the double superheterodyne tuner, a circuit portion containing an RF amplifier, the first mixer and the first local oscillator, and a circuit portion containing the second mixer, the second local oscillator and a second intermediate amplifier are divided by a space, and each of the circuit portions is surrounded by shielding plates. In this case, a large number of shielding plates are necessary to obtain a sufficient shielding effect. Furthermore, large area of arranging the functional circuits and the space for dividing the circuit portions are required, thereby disturbing a miniaturizing the casing of the tuner.

SUMMARY OF THE INVENTION

The present invention has been developed in order to remove the above-described drawbacks inherent in the conventional tuners.

It is, therefore, an object of the present invention to provide a new and useful double superheterodyne tuner which is capable of miniaturizing the casing of the tuner effectively with a high shielding effect.

Another object of the present invention is to provide the double superheterodyne tuner which is capable of simplifying the assembly of circuit blocks and the adjustment of each block and the total characteristics of the circuit blocks.

In order to achieve the above-described object of the present invention, there is provided a double superheterodyne tuner which comprises a first mixing portion containing $IF_1$ amplifying means, a second mixing portion containing $IF_1$ amplifying means, each of which includes a microstrip circuit on a separate board, each of the mixing portion is arranged in a manner such that the grounded surfaces thereof are contacted each other, a bandpass filter for passing the $IF_1$ signal ($IF_1$ BFP) therethrough coupled between each of the mixing portions, an input circuit portion including a wide range RF signal amplifier and arranged to one side of the mixing portion and $IF_1$ BPF, and an output circuit portion including a second intermediate frequency amplifier and arranged to another side of the mixing portion and $IF_1$ BPF.

The piled mixing portion and $IF_1$ BPF portion are preferable to form in one body and detachable from the remaining circuit portions.

BRIEF DESCRIPTION OF THE DRAWINGS

The object and features of the present invention will become more readily apparent from the following detailed description of the preferred embodiment taken in conjunction with the accompanying drawings in which.

The same or corresponding elements and parts are designated at like reference numerals throughout the drawings.

DETAILED DESCRIPTION OF THE INVENTION

Prior to describing the present invention, a principle of the double superheterodyne tuner and a conventional assembly thereof will be discussed for a better understanding of the present invention.

Figure 1:
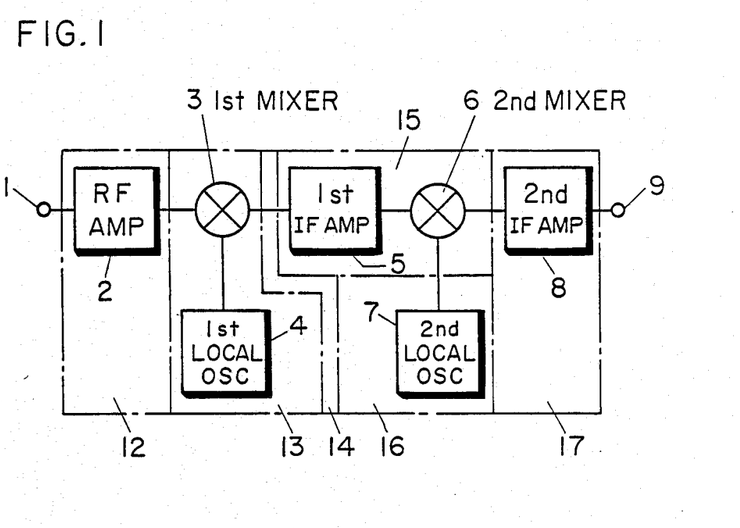
FIG. 1 is a block diagram showing a principle of a double superheterodyne tuner.

FIG. 1 shows a block diagram showing the double superheterodyne tuner. The reference 1 is an input terminal for receiving an RF signal; element 2 is RF amplifying section consisting for a bandpass filter having a necessary passband of VHF or UHF, an AGC circuit and an RF amplifier for adjusting an output of the RF amplifying section to a desired level; element 3 is a first mixer for converting a desired TV channel signal received by the RF amplifying section into the IF$_1$ signal by mixing with a local oscillator signal from a variable-frequency first local oscillator 4. The reference 5 is a bandpass filter or an IF$_1$ amplifying circuit including a bandpass filter for selectively passing the IF$_1$ signal from the first mixer 3; element 6 is a second mixer for converting the IF$_1$ signal into the IF$_2$ signal by mixing a second local oscillator frequency from a second local oscillator 7 with the IF$_1$ signal from the IF$_1$ amplifying circuit 5. The output of the second mixer 6 is supplied to an IF$_2$ amplifying circuit 8 which includes a bandpass filter for selectively passing the IF$_2$ signal from the second mixer 6 and an amplifier, and the output of the IF$_2$ amplifying circuit 8 is supplied to an output terminal 9.

Figure 2:
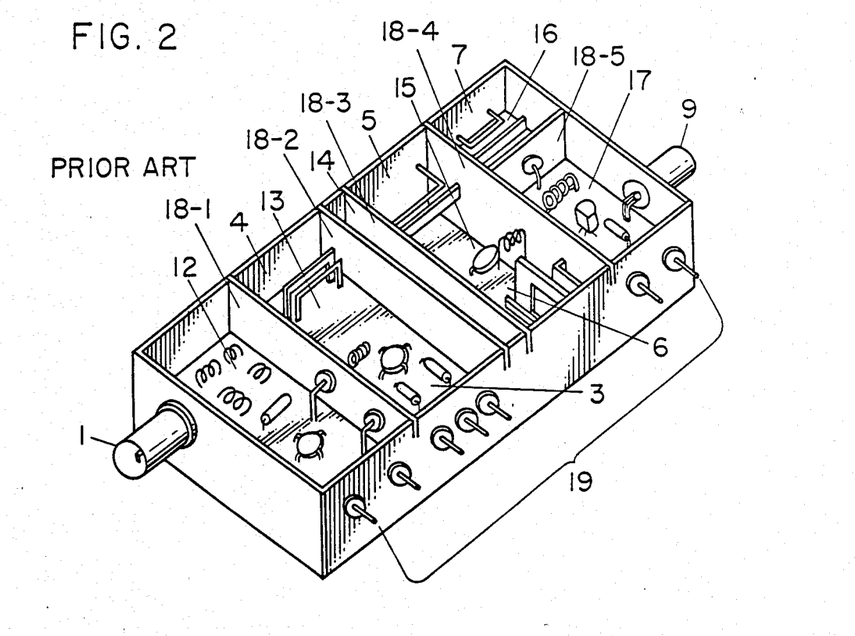
FIG. 2 is a schematic perspective view showing a conventional double superheterodyne tuner.
Figure 3A:
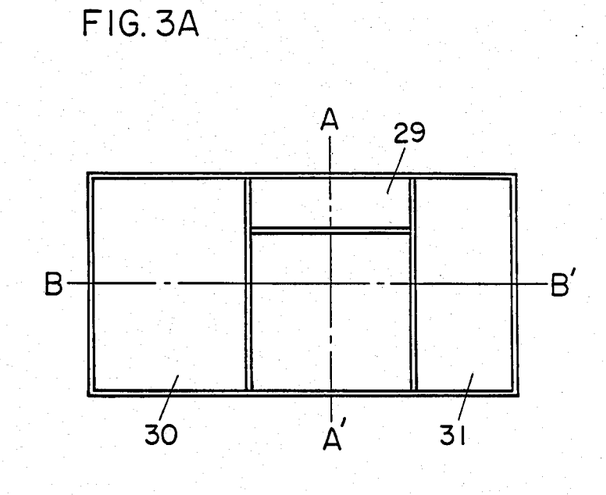
FIG. 3A is a schematic plane view showing an inner portion of a double superheterodyne tuner according to the present invention.
Figure 3B:
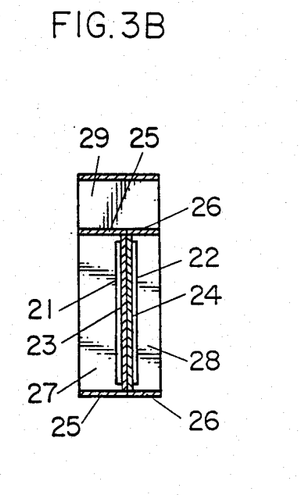
FIGS. 3B and 3C are schematic cross-sectional views taken along the line A—A' and B—B' of FIG. 3A respectively.
Figure 3C:
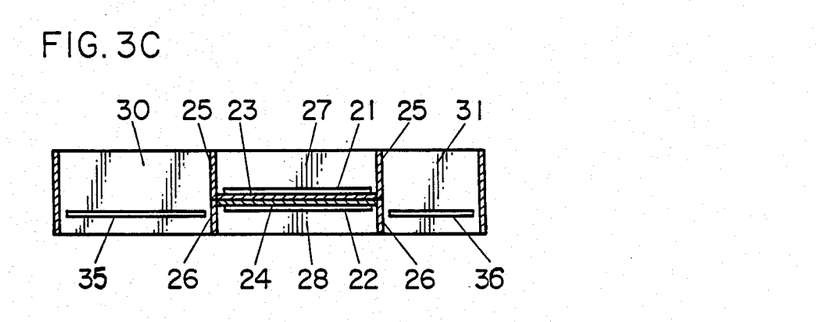

FIG. 2 illustrates a conventional three-dimensional circuit arrangement corresponding to the tuner shown in FIG. 1. The reference 12 is a circuit portion containing the RF amplifying circuit; element 13 is a circuit portion containing the first local oscillator 4 and the first mixer; element 14 is a shielding space for preventing coupling between the first local oscillator and the second local oscillator; element 15 is a circuit portion containing the IF$_1$ amplifying circuit 5 and the second mixer 6; element 16 is a circuit portion containing the second local oscillator; and element 17 is a circuit portion containing the IF$_2$ amplifying circuit 8. Each of the circuit portions 12, 13, 15, 16, 17 and the shielding space 14 is shielded by shielding plates 18-1 through 18-5 respectively. The reference 19 comprises terminals for supplying electric power to the various circuit portion.

The RF input signal is supplied to the input terminal 1 and the IF$_2$ output signal is delivered from the output terminal 9 respectively.

However, since the circuit portions 13, 15 and 16 are operated at very high frequency on the order of GHZ, the aforementioned drawbacks exist.

Referring now to FIGS. 3A through 3C and FIG. 4, double superheterodyne tuner according to the present invention is shown. In the figures, circuit components consisting of each of functional circuit portions are omitted. The reference 21 and 22 are printed boards on one surface of each of which a microstrip circuit for a mixing portion including a local oscillator and amplifier is printed. On another surface of each of the printed boards, a means for electrically grounding is provided. One of the printed boards is used as a circuit for a first mixing means of IF$_1$ and another a circuit for a second mixing means of IF$_2$. The printed boards 21 and 22 are arranged in a manner that the grounded surfaces thereof are contacted face to face holding chassis 23 and 24 therebetween. One of the chassis 23 and 24 may be removed by using the other chassis as a common chassis. Each of the printed boards 21 and 22 is respectively surrounded by a square case 25 and 26. In a space 27 surrounded by the chassis 23 and the square case 25, the first mixing portion which consists of the first mixer 3, the first local oscillator 4 and the IF$_1$ amplifier connected to the latter stage of the first mixer 3 are located. Similarly, the second mixing portion which consists of the second mixer 6, the IF$_1$ amplifier connected to the former stage of the second mixer 6 and the second local oscillator 7 are located in a space 28 surrounded by the chassis 24 and the square case 26. In this case, the square cases 25 and 26 may be make separately or as one body. Also, the chassis 23 and the case 25, or the chassis 24 and the case 26 can be made in the same manner. A container 29 including an IF$_1$ bandpass filter (IF$_1$ BPF) such as a dielectric filter is located adjacent to one side wall of each of the cases 25 and 26 in order to allow through signals to or from the mixing portions contained in the spaces 27 and 28. On one side wall common to three of the cases 25, 26 and the container 29, an input portion container 30 containing the RF amplifier 2 therein is connected. On another side wall common to three of the cases 25, 26 and the container 29, an output portion container 31 containing the IF$_2$ amplifying circuit 8 is connected in the same manner. Finally, an upper lid 33 and a bottom lid 34 are provided.

In this embodiment, the first mixing portion and the second mixing portion are formed by microstrip circuits on separated printed boards 21 and 22, and are arranged back to back. Therefore, the first and second mixing portions are inevitably mounted on different printed boards from those 35 and 36 on which the input portion and the output portion are formed. The first mixing portion and the second mixing portion are shielded sufficiently from each other by a chassis at the back to back portion without any shielding plates or shielding spaces or gaps. Furthermore, since the IF$_1$ BPF is mounted on a common side wall of the mixing portions, a miniaturized or a compact high frequency circuit portion of the double superheterodyne tuner may be realized. In addition to these, the input portion and the output portion are separated by the high frequency circuit portion therebetween, such that excellent isolation characteristics or shielding effects are obtained with a small number of shielding means.

Figure 4:
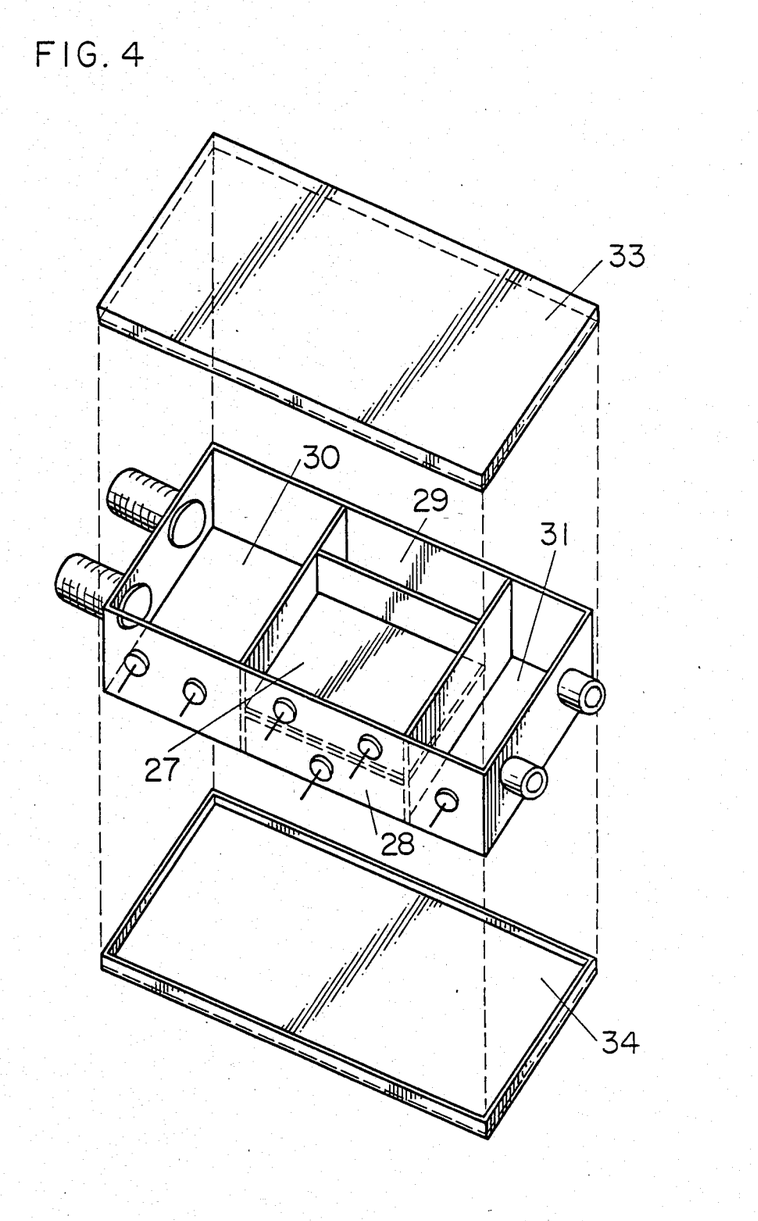
FIG. 4 is a schematic perspective view showing an embodiment of the double superheterodyne tuner according to the present invention.
Figure 5:
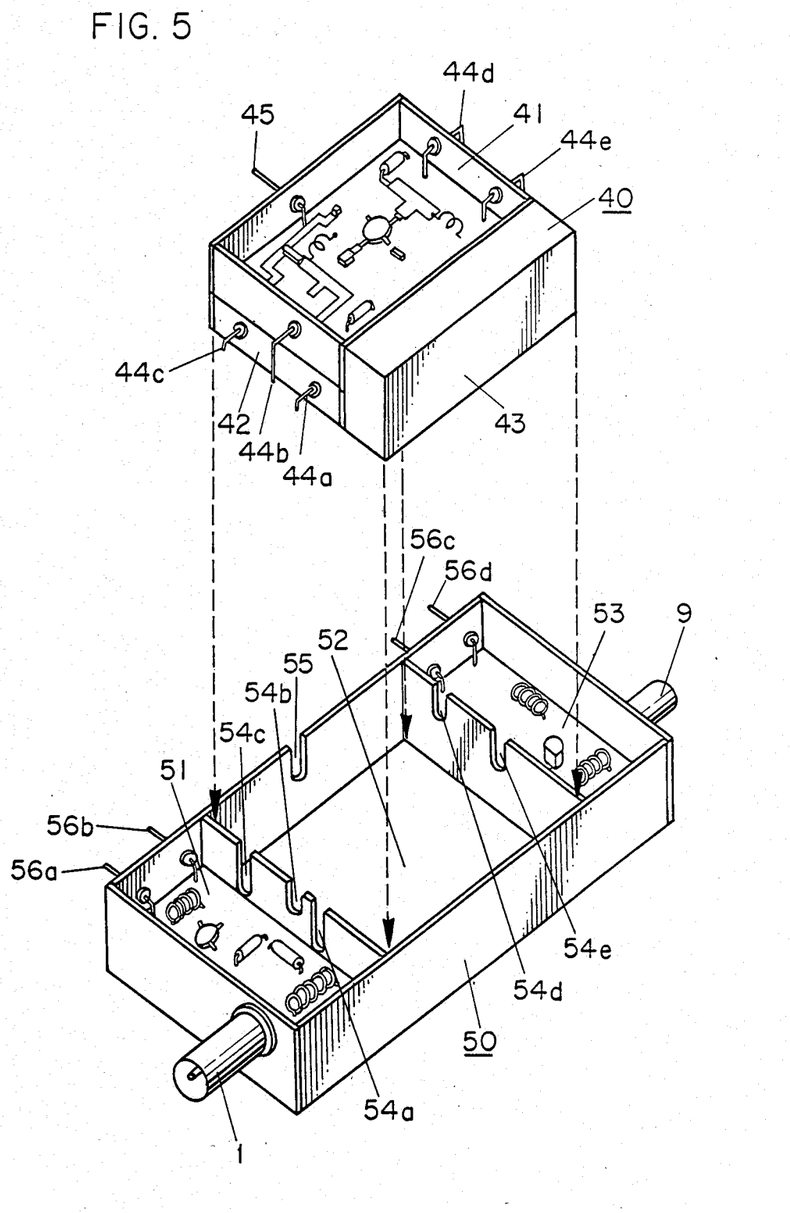
FIG. 5 is a schematic perspective view showing another embodiment of the double superheterodyne tuner according to the present invention.

FIG. 5 shows another embodiment of the double superheterodyne tuner according to the present invention. In this embodiment, a first block 40 and a second block 50 are provided. In the first block 40, reference 41 designates a second mixing portion including an IF$_1$ amplifier, the second mixer 6 and second local oscillator 7 of FIG. 1 and corresponds to the portion 28 of FIG. 4; element 42 is a first mixing portion including the first mixer 3, the first local oscillator of FIG. 1 and an IF$_1$ amplifier and corresponds to the portion 27 of FIG. 4; element 43 is a dielectric bandpass filter means corresponds to the container 29 of FIG. 4. Each of the first and second mixing portions 42 and 41 may be mounted on a separated printed boards in a common housing. However it is possible to mount each of the first and second mixing portions in individual housings. In any case, the IF$_1$ BPF portion 43, and the first and second mixing portions 42 and 41 are mounted or connected in one block. The references 44a through 44e and 45 are terminals for input and output signals, and DC control voltages or DC power supply voltages. The block 40 constitutes a high frequency circuit portion of the double superheterodyne tuner according to the present invention.

In the second block 50, the reference 51 is an input portion including the RF amplifying circuit 2 which corresponds to the input portion container 30 of FIG. 4. The reference 52 designates a space portion for detachably mounting the first block 40 therein. Numeral 53 is an output portion including the IF$_2$ amplifying circuit 8 which corresponds to the output portion container 31 of FIG. 4. The references 54a through 54e are recesses for receiving the terminals 44a through 44e of the first block 40 respectively. When the first block 40 is inserted into the space portion 52 of the second block 50, the terminals 44a, 44b, and 44c are connected to terminals such as clipping members (not shown in FIG. 5) provided on a printed circuit board of the RF amplifying circuit 2 located in the input portion 51 through the recesses 54a, 54b, and 54c respectively. In the same manner, the terminals 44d and 44e are connected to terminals (not shown) provided on a printed circuit board of the IF$_2$ amplifying circuit 8 located in the output portion 53 through the recesses 54d and 54e respectively. Thus, the first block 40 and the second block 50 are electrically connected to each other. The DC voltage supplying terminal 45 of the first block 40 is received by a recess 55 provided at side wall of the space portion 52 of the second block 50. The references 56a and 56b are DC voltage supplying terminals for the RF amplifying circuit 2 and the references 56c and 56d are DC voltage supplying terminals for the IF$_2$ amplifying circuit 8. The input signal is supplied to RF input terminal 1 connected to the RF amplifying circuit 2 and the output signal is derived from IF$_2$ output terminal 9 connected to the IF$_2$ amplifying circuit 8.

In this embodiment, the high frequency circuit arrangements of the double superheterodyne tuner are concentrated in the first block 40, and this block 40 is so designed that it is detachable from the second block 50 in which the input portion 51 and the output portion 53 are provided, therefore it is possible, in addition to miniaturizing the housing of the tuner and obtaining high shielding effects, to simplify the adjustment or the measurement of the circuit characteristics by eliminating the complex and difficult work of disconnecting and connecting circuits. Furthermore, the assembly of the tuner is simplified.

Figure 6A:
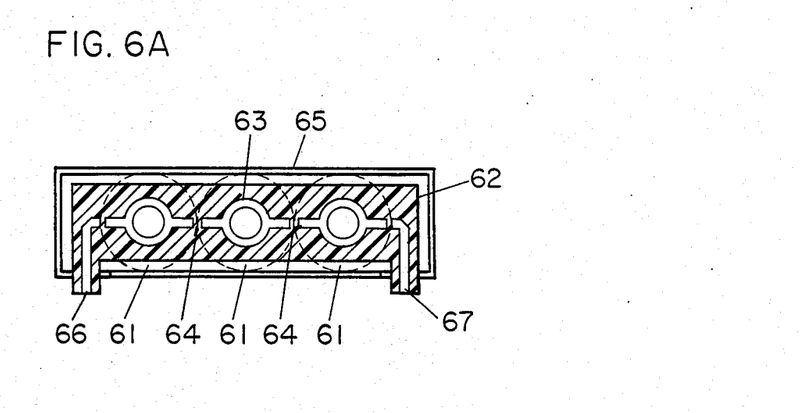
FIGS. 6A to 6C are cross-sectional views each respectively showing an embodiment of a bandpass filter which is employed in a first intermediate frequency amplifier of the double superheterodyne tuner according to the present invention.
Figure 6B:
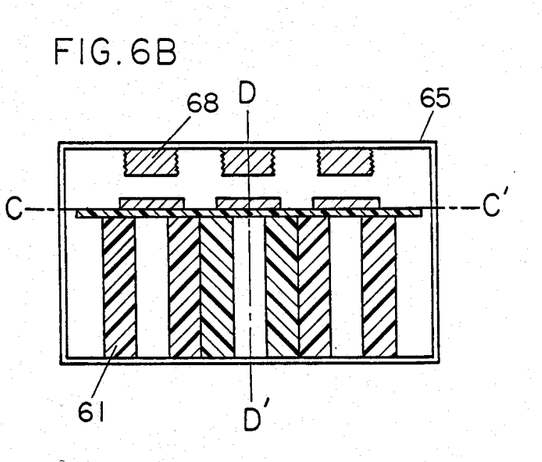
Figure 6C:
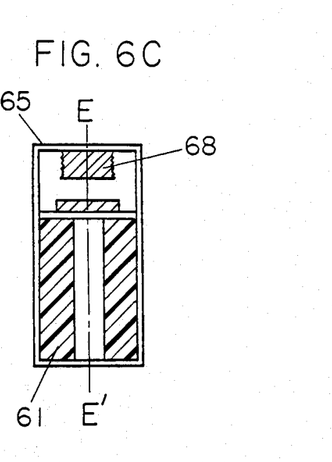

FIGS. 6A through 6C show an embodiment of a bandpass filter of the double superheterodyne tuner according to the present invention. The bandpass filter comprises a plurality of dielectric resonators 61 having hollowed cylindrical dielectrics arranged in parallel. On the tops of the resonators 61, a printed circuit board 62 made of insulative plate such as Teflon (trade name of E. I. du Pont de Nemours and Co.) is provided. A conductive pattern 63 is printed on the printed circuit board 62 to make a gap pattern 64 which consists of a coupling capacity for the resonators 61. Strip lines 66 and 67 are printed on both sides of the printed circuit board 62, one end of which is capacitively coupled to the conductive pattern 63 and another end is elongated outside a casing 65. The strip lines 66 and 67 are used as an input and an output terminals of the bandpass filter. Screw 68 are provided opposite each dielectric resonator 61 for adjusting the frequency characteristics thereof. A screw 68 may be eliminated when the capacitance of its resonator 61 is adjusted by shaving or cutting the dielectrics of the resonator.

Figure 7:
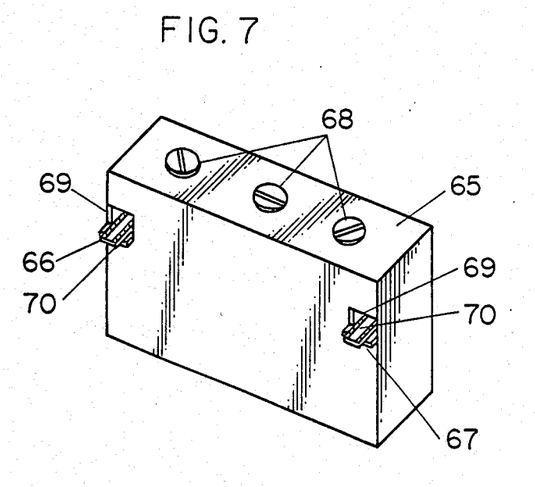
FIG. 7 is a schematic perspective view of the bandpass filter shown in FIGS. 6A through 6C.

FIG. 7 is a perspective view of the bandpass filter shown in FIGS. 6A through 6C. At both end portions of one of the surfaces of the casing 65, openings 69 are provided by bending a part of the wall of the casing 65 downwards. Each of the strip lines 66 and 67 is taken out from the openings 69 and grounded on a bended portion 70.

According to the filter construction, the input terminal 66 and the output terminal 67 are easily taken out without using an expensive connector or a lead which is encapsulated by an insulator. The terminals 66 and 67 can be fixed on the bended portion 70 to strengthen the terminals 66 and 67, and furthermore grounded near the signal line.

Figure 8:
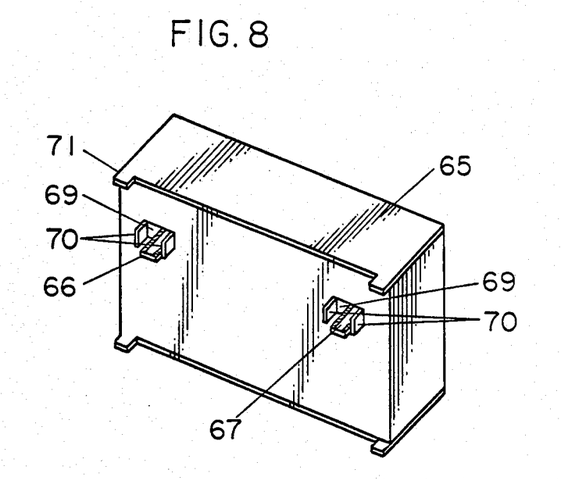
FIG. 8 is a schematic perspective view showing another embodiment of the bandpass filter.

FIG. 8 is another embodiment of the bandpass filter shown in FIGS. 6A through 6C. In the embodiment, the bended portion 70 is provided by bending a part of the casing 65 like a French window. The reference 71 is a projection for mounting the case 65 to the aforementioned first and second mixing portions 41 and 42.

In FIG. 7 and FIG. 8, the input terminal 66 and the output terminal 67 are taken out from same surfaces of the casing 65, whereas it is possible to take out from different surfaces of the casing 65.

What is claimed is:

1. A double superheterodyne tuner comprising:
   a first printed circuit board on one surface of which a first mixing portion including a first local oscillator is provided and on another surface of which a grounding means is provided;
   a second printed circuit board on one surface of which a second mixing including a second local oscillator is provided and on another surface of which a grounding means is provided;
   a casing having two containing spaces separated by a separating plate;
   each of said first and second printed boards is disposed in said casing in a back to back relationship and separated between said two containing spaces in such a manner that said surfaces on which said grounding means are provided are arranged so as to face each other and hold said separating plate therebetween;
   a filter container including a bandpass filter for filtering a first intermediate frequency arranged adjacently to a side wall common to said two containing spaces of said casing;
   an input circuit container including a radio frequency signal amplifier arranged adjacently to one common side wall of said two containing spaces of said casing and said filter container, and
   an output circuit container including an amplifier for amplifying at a second intermediate frequency arranged adjacently to another common side wall of said two containing spaces of said casing and said filter container.

2. A double superheterodyne tuner as claimed in claim 1, wherein said casing and filter container are formed in one block and detachably mounted to said input circuit container and output circuit container.

3. A double superheterodyne tuner comprising:
   a first printed circuit board on one surface of which a first mixing portion including a first local oscillator is provided and on another surface of which a grounding means is provided;
   a second printed circuit board on one surface of which a second mixing portion including a second local oscillator is provided and on another surface of which a grounding means is provided;
   two separated casings each having a containing space therein;
   said first printed circuit board is mounted on an inner bottom surface of one of said two separated casings and said second printed circuit board is mounted on an inner bottom surface of the other of said two separated casings in such a manner that said surfaces of said first and second printed circuit boards on which said grounding means is provided is arranged so as to face said respective inner bottom surface, and said two separated casings are in contact with each other at outer bottom faces thereof in a back to back relationship;

a filter container including a bandpass filter for filtering a first intermediate frequency arranged adjacently to a side wall common to said two containing spaces of said two separated casings;

an input circuit container including a radio frequency signal amplifier arranged adjacently to one common side wall of said two containing spaces of said two separated casings and said filter container, and an output circuit container including an amplifier for amplifying at a second intermediate frequency arranged adjacently to another common side wall of said two containing spaces of said two separated casings and said filter container.

4. A double superheterodyne tuner comprising:

a first printed circuit board on one surface of which a first mixing portion including a first local oscillator is provided and an another surface of which a grounding means is provided;

a second printed circuit board on one surface of which a second mixing portion including a second local oscillator is provided and on another surface of which a grounding means is provided;

a casing having two containing spaces separated by a separating plate;

each of said first and second printed circuit boards is disposed in said casing in a back to back relationship and separated between said two containing spaces in such a manner that said surfaces on which said grounding means are provided are arranged so as to face each other and hold said separating plate therebetween;

a filter container including a bandpass filter for filtering a first intermediate frequency arranged adjacently to a side wall common to said two containing spaces of said casing;

an input circuit container including a radio frequency signal amplifier arranged adjacently to one common side wall of said two containing spaces of said casing and said filter container, and an output circuit container including an amplifier for amplifying at a second intermediate frequency arranged adjacently to another common side wall of said two containing spaces of said casing and said filter container;

wherein said filter container comprises a housing, a plurality of resonators formed of hollowed cylindrical dielectrics located in said housing, a printed circuit board affixed to said resonators and having conductive patterns for forming coupling capacity between said resonators and strip lines for input and output terminals, and wherein one end of each of said strip lines is projected outside of the housing through an opening made by forming a predetermined bent part of said housing.

5. A double superheterodyne tuner comprising:

an input means for amplifying an input signal;

a first local oscillating means for generating a variable frequency signal;

a first mixing means for obtaining a first intermediate frequency signal by converting the frequency of an output of said input means by mixing with an output of said first local oscillating means;

a first intermediate frequency processing means for limiting a passband of an output of said first mixing means and for amplifying said output;

a second local oscillating means for generating a fixed frequency signal;

a second mixing means for obtaining a second intermediate frequency signal by converting the frequency of an output of said first intermediate frequency processing means by mixing with an output of said second local oscillating means, and a second intermediate frequency processing means for amplifying an output of said second mixing means;

wherein said first local oscillating means, first mixing means, first intermediate frequency filtering means, second local oscillating means and second mixing means are mounted in a first block, and said input means and a second intermediate frequency processing means are mounted in a second block, and said first block is detachably mounted in said second block; and wherein said first intermediate frequency processing means comprises a housing, a plurality of resonators formed of hollowed cylindrical dielectrics located in said housing, a printed circuit board affixed to said resonators and having conductive patterns for forming coupling capacity between said resonators and strip lines for input and output terminals, and wherein said strip lines are taken out at one end thereof through openings provided in the housing.

* * * * *